US009562959B2

(12) United States Patent
Miyazaki et al.

(10) Patent No.: US 9,562,959 B2
(45) Date of Patent: *Feb. 7, 2017

(54) MRI DETECTION OF TISSUE MACROMOLECULAR CHARACTERISTICS USING MTC EFFECTS

(71) Applicant: TOSHIBA MEDICAL SYSTEMS CORPORATION, Otawara-Shi, Tochigi-Ken (JP)

(72) Inventors: Mitsue Miyazaki, Des Plaines, IL (US); Cheng Ouyang, Vernon Hills, IL (US); Xiangzhi Zhou, Vernon Hills, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1099 days.

This patent is subject to a terminal disclaimer.

(21) Appl. No.: 13/705,582

(22) Filed: Dec. 5, 2012

(65) Prior Publication Data

US 2014/0062476 A1 Mar. 6, 2014

Related U.S. Application Data

(63) Continuation-in-part of application No. 13/601,723, filed on Aug. 31, 2012.

(51) Int. Cl.
*G01R 33/50* (2006.01)
*G01R 33/54* (2006.01)
(Continued)

(52) U.S. Cl.
CPC ............ *G01R 33/54* (2013.01); *G01R 33/341* (2013.01); *G01R 33/5605* (2013.01); *G01R 33/50* (2013.01)

(58) Field of Classification Search
USPC ... 324/300–322; 600/407–435; 382/128–131
See application file for complete search history.

(56) References Cited

U.S. PATENT DOCUMENTS

2014/0062473 A1* 3/2014 Miyazaki ............... G01R 33/50
324/308
2014/0062476 A1* 3/2014 Miyazaki ........... G01R 33/5605
324/309

(Continued)

FOREIGN PATENT DOCUMENTS

JP 11-313810 11/1999
JP 2002-248092 9/2002

OTHER PUBLICATIONS

Balaban et al., "Magnetization Transfer Contrast in Magnetic Resonance Imaging," Magnetic Resonance Quarterly, vol. 8, No. 2, pp. 116-137 (1992).

(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

A magnetic resonance imaging (MRI) system and method (a) acquires k-space data for a patient ROI over a predetermined band of RF frequencies using RF excitation pulses having respectively corresponding RF frequencies incrementally offset from a nuclear magnetic resonant (NMR) Larmor frequency for free nuclei over a predetermined range of different offset frequencies in which target macromolecule responses are expected and to process such acquired data into spectral data for voxels in the ROI; (b) analyzes the acquired spectral data to provide spectral peak width data corresponding to tissue values in the ROI for macromolecules participating in magnetization transfer contrast (MTC) effects producing said spectral data; and (c) stores (Continued)

and/or displays data representative of tissue values of the ROI which values are different for different tissues.

23 Claims, 16 Drawing Sheets

(51) Int. Cl.
 *G01R 33/341* (2006.01)
 *G01R 33/56* (2006.01)

(56) References Cited

U.S. PATENT DOCUMENTS

| | | | | |
|---|---|---|---|---|
| 2014/0361776 | A1* | 12/2014 | Miyazaki | G01R 33/5605 324/322 |
| 2015/0141804 | A1 | 5/2015 | Rooney et al. | |
| 2015/0247908 | A1 | 9/2015 | Liu et al. | |

OTHER PUBLICATIONS

Wolff, et al., "Magnetization Transfer Contrast (MTC) and Tissue Water Proton Relaxation In Vivo," *Magn. Reson. Med.*, vol. 10, pp. 135-144 (1989).

Balaban, et al., "Magnetization Transfer Contrast in Magnetic Resonance Imaging," *Magnetic Resonance Quarterly*, vol. 8, No. 2, pp. 116-137 (1992).

Pike, et al,, "Magnetization Transfer Time-of-Flight Magnetic Resonance Angiography," *Magn, Reson. Med.*, vol. 25, pp. 372-379 (1992).

Ward, et al., "A New Class of Contrast Agents for MRI Based on Proton Chemical Exchange Dependent Saturation Transfer (CEST)," *J. Magn. Reson.*, vol. 143, pp. 79-87 (2000).

van Zijl, et al., "Chemical Exchange Saturation Transfer (CEST): What is in a Name and What Isn't?," *Magn. Reson. Med*, vol. 65, pp. 927-948 (2011).

Koenig, et al., "Relaxometry of Brain: Why White Matter Appears Bright in MRI," *Magn. Reson. Med.*, Vol, 14, pp. 482-495 (1990).

Koenig, "Cholesterol of Myelin is the Determinant of Grey-White Contrast in MRI of Brain," *Magn. Reson. Med.*, vol. 20, pp. 285-291 (1991).

Bottomley, et al., "Anatomy and Metabolism of the Normal Human Brain Studied by Magnetic Resonance at 1.5 Tesla," *Radiology*, vol. 150, pp. 441-446 (1984).

Fralix, et al., "Lipid Bilayer and Water Proton Magnetization Transfer: Effect of Cholesterol," *Magn. Reson. Med.*, vol. 18, pp. 214-223 (1991).

Zhou, et al., "Chemical exchange saturation transfer imaging and spectroscopy," *Progress in Nuclear Magnetic Resonance Spectroscopy*, vol. 48, pp. 109-136 (2006).

Constable, et al., "The Loss of Small Objects in Variable TE Imaging: Implications for FSE, RARE, and EPI," Magnetic Resonance in Medicine, vol. 28, pp. 9-24 (1992).

International Search Report issued Sep. 24, 2013 in PCT/JP2013/073234.

V. L. Yarnykh et. al., "Macromolecular proton fraction mapping of the human liver in vivo: technical feasibility and preliminary observations in hepatic fibrosis," Proc. Intl. Soc. Mag. Reson. Med. 19 (2011), Jul. 13, 2011, p. 392.

R. Scheidegger, et al., "Quantitative modeling of in-vivo amide proton transfer measurements in the human brain indicates a dominant signal contribution from proteins with short T2 relaxation times," Proc. Intl. Soc. Mag. Reson. Med. 19 (2011), Jul. 13, 2011, p. 2768.

J. Hua, et al., "Quantitative Description of Magnetization Transfer (MT) Asymmetry in Experimental Brain Tumors," Proc. Intl. Soc. Mag. Reson. Med. 15 (2007), May 19, 2007, p. 882.

\* cited by examiner

GM (gray) and WM (white) Maps

A2 Map

MRI DETECTION OF TISSUE MACROMOLECULAR CHARACTERISTICS USING MTC EFFECTS

RELATED APPLICATION

This application is a continuation-in-part of our copending U.S. application Ser. No. 13/601,723 filed Aug. 31, 2012, the entirety of which is hereby incorporated by reference.

FIELD

The subject matter below relates generally to magnetic resonance imaging (MRI) apparatus and process. In particular, the MRI apparatus and method described below involve the magnetization transfer contrast (MTC) effect.

DETAILED DESCRIPTION

Figure 1:
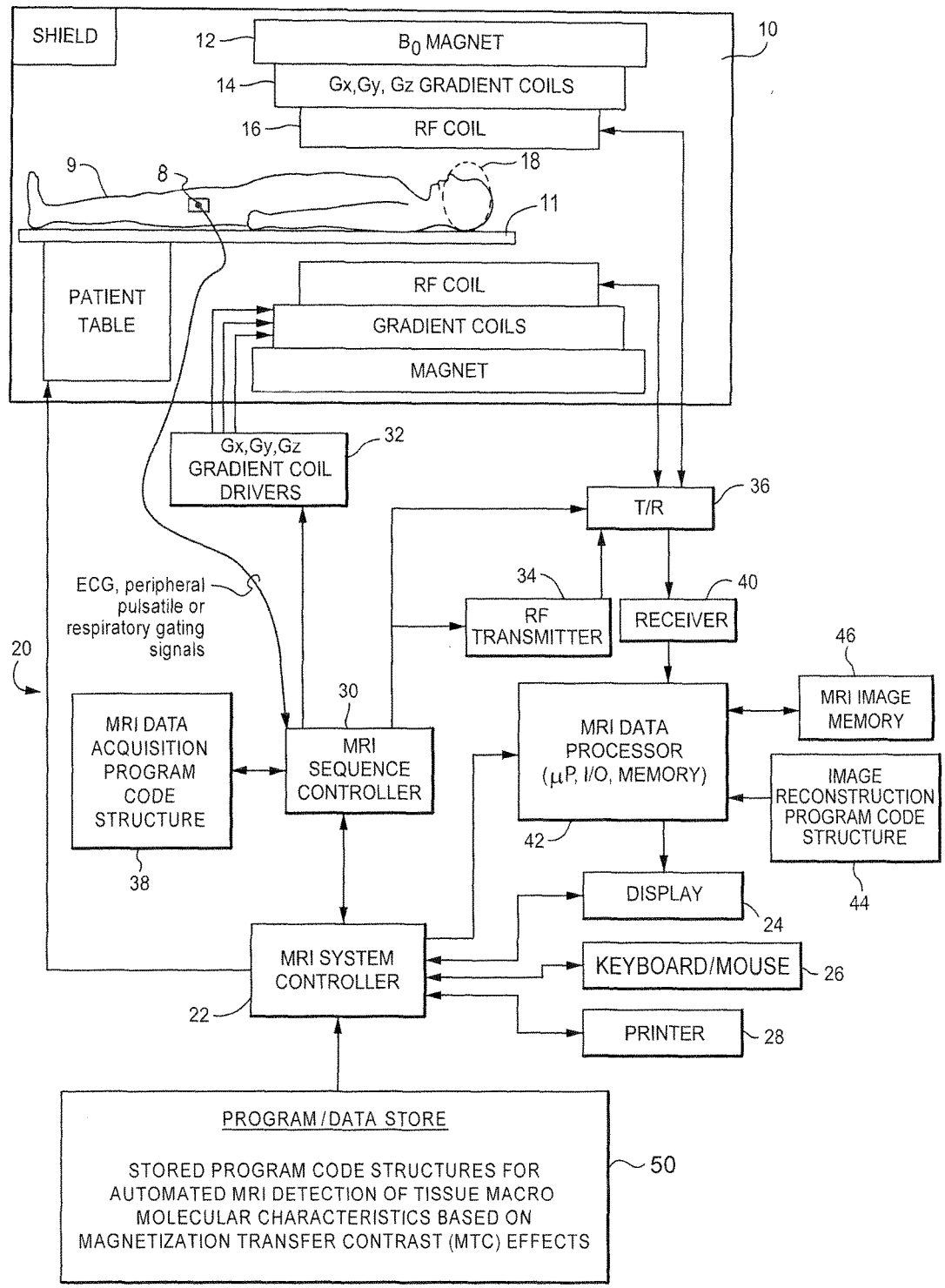
FIG. 1 is a high-level schematic block diagram of an exemplary MRI system embodiment configured to provide automated MRI detection of tissue macromolecular characteristics using the MTC effect.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field Bo magnet 12, a Gx, Gy and Gz gradient coil set 14 and an RF coil assembly 16. Along the horizontal axis of this cylindrical array of elements is an imaging region 18 shown as substantially encompassing the anatomy of interest (i.e., region of interest or "ROI") for a patient 9 (e.g., the abdomen) supported by a patient bed or table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as RF transmitter 34 and transmit/receive switch 36 (if the same RF coil is used for both transmission and reception). As those skilled in the art will appreciate, many different types of RF coils (e.g., whole body coils, surface coils, birdcage coils, coil arrays, etc.) may be employed to transmit and/or receive RF signals to/from the ROI in the imaging volume. As will also be appreciated, one or more suitable physiological transducers 8 may be affixed to the patient's body to provide ECG (electrocardiogram), respiratory and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30—e.g., to generate MR images including MTC effects using operator and/or system inputs defining particular MRI data acquisition sequence parameters.

The MRI system 20 includes an RF receiver 40 providing input to data processor 42 so as to create processed image data which may be sent to display 24 (or elsewhere for later viewing). The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for MRI detection of tissue macromolecular characteristics using MTC effects, a related graphical user interface (GUI), operator inputs to same, etc.) are stored in computer readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those skilled in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged region space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

It is usually assumed that proton exchange exist between relatively free water protons and restricted protons in macromolecules. Z-spectra measured by magnetic resonance imaging (RI) as been used to evaluate exchangeable protons. In the brain, the grey and white matter, containing cell bodies and axons with a myelin sheath of neurons, may contribute in different exchangeable environments. Here, we propose that there are at least two exchangeable environments due to ultra-short spin-spin relaxation (T2) in the grey and white matter. In this work, we applied a physical Lorentzian model to MRI Z-spectra and curve-fitted two exchangeable environments in human brains. In our results, we found that the two exchangeable compartments indicate populations of short-T2 exchangeable protons (T2e~15 μs) and long-T2 exchangeable protons (T2e~800 μs) in healthy volunteers. The analysis of short T2e and long T2e may provide a novel dimension of MRI contrast, which was not previously reported.

Magnetization transfer contrast (MTC) effects make it possible to observe the interaction of bulk "free" water protons with "restricted" protons in macromolecules of tissues and/or organs having different macromolecular compositions. Thus, depending on macromolecule properties, it is possible to generate MRI contrast in different human tissues using the MTC effect and thus vary MRI contrast. The well known contrast effects of MTC have been demonstrated in evaluation of morphology of the brain, kidney, myocardium, as well as improvement of contrast between blood and brain parenchyma in intracranial MR angiography.

The MTC effect has also been further investigated to study the chemical exchange saturation transfer (CEST) of exchangeable protons that resonate at different frequencies from bulk water protons by selectively saturated NMR nuclei using RF irradiations. The major contributors to CEST are, in general, amide, amine and hydroxyl protons, which are MTC exchangeable protons with bulk water protons. The CEST spectra (sometimes called Z-spectra) is a spectrum of the MTC effect achieved by plotting the MR signal intensity of free water protons (which decreases with off-resonance RF excitation pulses). An early conception of the MTC effect was that short T2 components of macromolecules, which are not observable in spectroscopy, become observable by detecting a decrease in the signal from bulk water protons (caused by MTC exchange of magnetization with protons having short T2 components).

The contrast between white and grey matter in brain MRI has been investigated by a number of researchers. It is known that relative brightness of adult white matter in T1-weighted images arises from myelin. However, the mechanisms responsible remain unknown. Some have conjectured that cholesterol of myelin was responsible.

The neurons have a cell body mainly located in the grey matter and an axon mainly located in the white matter. The axons are surrounded by a myelin sheath. Water protons within the axon should have relatively free movement, whereas water protons within the myelin sheath may be restricted in movement due to many layers of myelin sheathing.

We have hypothesized (and now demonstrated) that there are at least two exchangeable proton components—one long T2 component (T2el), which we observe in regular Z-spectra, and one ultra-short T2 component (T2es).

As noted, the MTC effect can be observed as a decrease of free proton NMR response signal, as a result of an exchange with nuclear magnetic resonance (NMR) magnetization macromolecules caused by applying an off-resonance (i.e., offset from the Larmor frequency of free protons) RF excitation pulse. The chemical exchange saturation transfer (CEST) spectra (sometimes referred to as Z-spectra, especially where protons of water ($H_2O$) are involved) is a spectrum derived from the MTC effect over a frequency range of about +/−5 ppm (or +/−650 Hz at 3 T). In order to obtain a Z-spectrum showing short T2/T2* components (or other NMR effects), one needs to acquire a relatively wide frequency range of MTC-affected proton signals. In particular, the NMR magnetization exchangeable proton in macromolecules may have multiple environments. In order to find corresponding multiple frequency components, at least two components including short and long T2/T2* components (or other NMR effects) are visualized—e.g., as on Z-spectra images by curve fitting.

In an exemplary embodiment, a "short" FWHM means a long T2/T2* component, which has about 70% of exchangeable protons. Conversely, a "long" FWHM means a "short" T2/T2* component occupying about 20% of exchangeable protons. The FWHM value is translated in the microsecond range and 30 μs is considered quite short. 600 μs T2/T2* is relatively long. It presently appears that the short T2/T2* component may represent exchangeable protons within the myelin sheath in an axon. The myelin sheath is located in the white matter. The long T2/T2* component is located in the cell body of neurons, which is located mainly in the grey matter of the brain. Thus, they are not normal or diseased.

In prior MTC spectral techniques, one needed to acquire each set of image data by using different offset frequencies for the MTC pulses and then to plot a spectrum by measuring the signal intensity of the region of interest (ROI). From the spectra, interaction of free water with protons of amide, amine and hydroxyl groups can be observed. In addition, MTC effects can be used to investigate restricted proton and free water exchanges of NMR magnetization to observe better contrast (or signal reduction in free water ROIs) by irradiating with an off-resonance frequency. However, no investigation of the relationship between restricted protons and free water was attempted to find the condition of restricted water protons of macromolecules.

It is now believed that the full width at half magnitude (FWHM) parameters of MTC-related spectra allow one to evaluate associated relative values of differing macromolecules. Areas of abnormal tissues (e.g., cancer cells) have different spectra as compared to those from normal tissues. By measuring the FWHM of spectra, one can estimate a value (e.g., T1, T2, T2/T2*, etc.) of the abnormal environment.

In order to obtain MTC-related spectra for such purposes, a suitable graphical user interface (GUI) for MTC-related spectra is required to set the desired frequency rage, increment of offset frequency and type of MRI data acquisition sequence.

Figure 2:
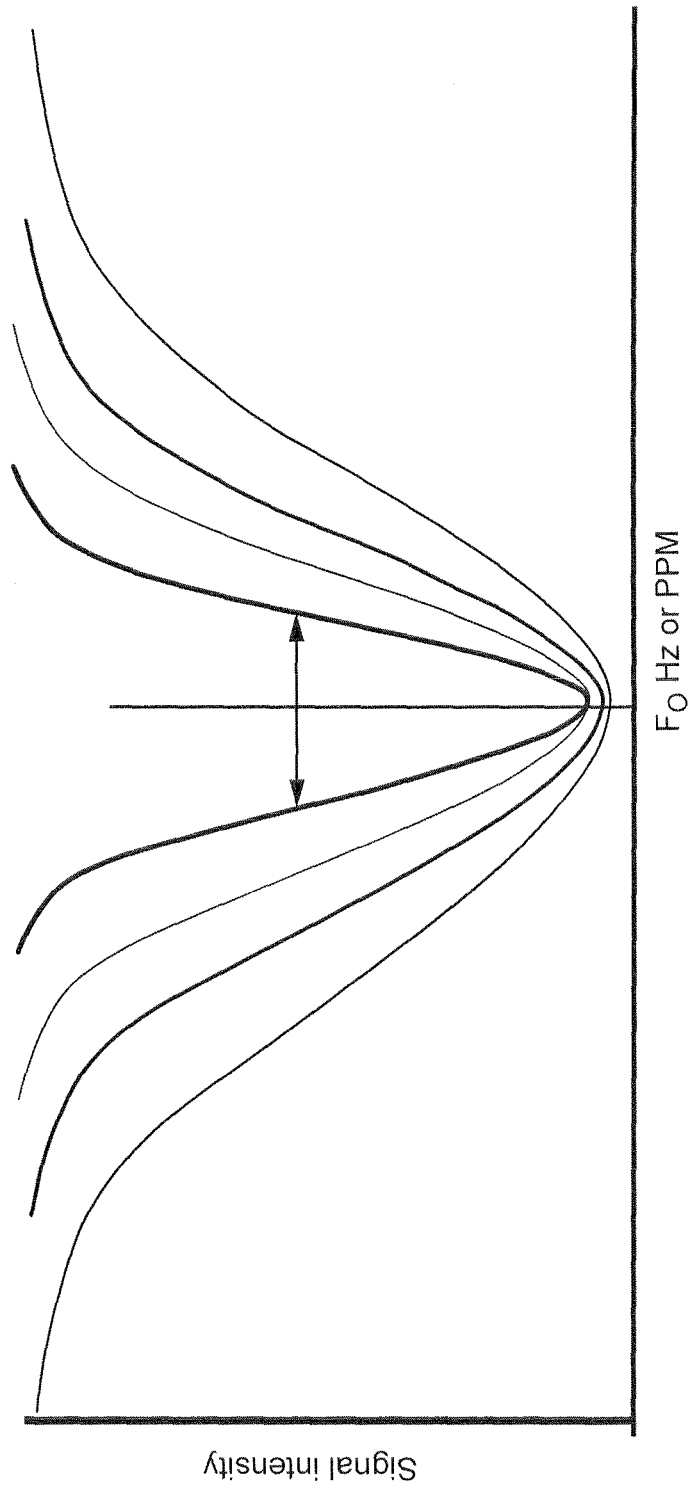
FIG. 2 is a graph of signal intensity versus frequency deviation from the Larmor nuclear magnetic resonant (NMR) frequency for an unrestricted NMR nuclei (i.e., a water proton) demonstrating that the full width half magnitude (FWHM) is inversely related to the T2 NMR parameter of coupled macromolecules.
Figure 3:
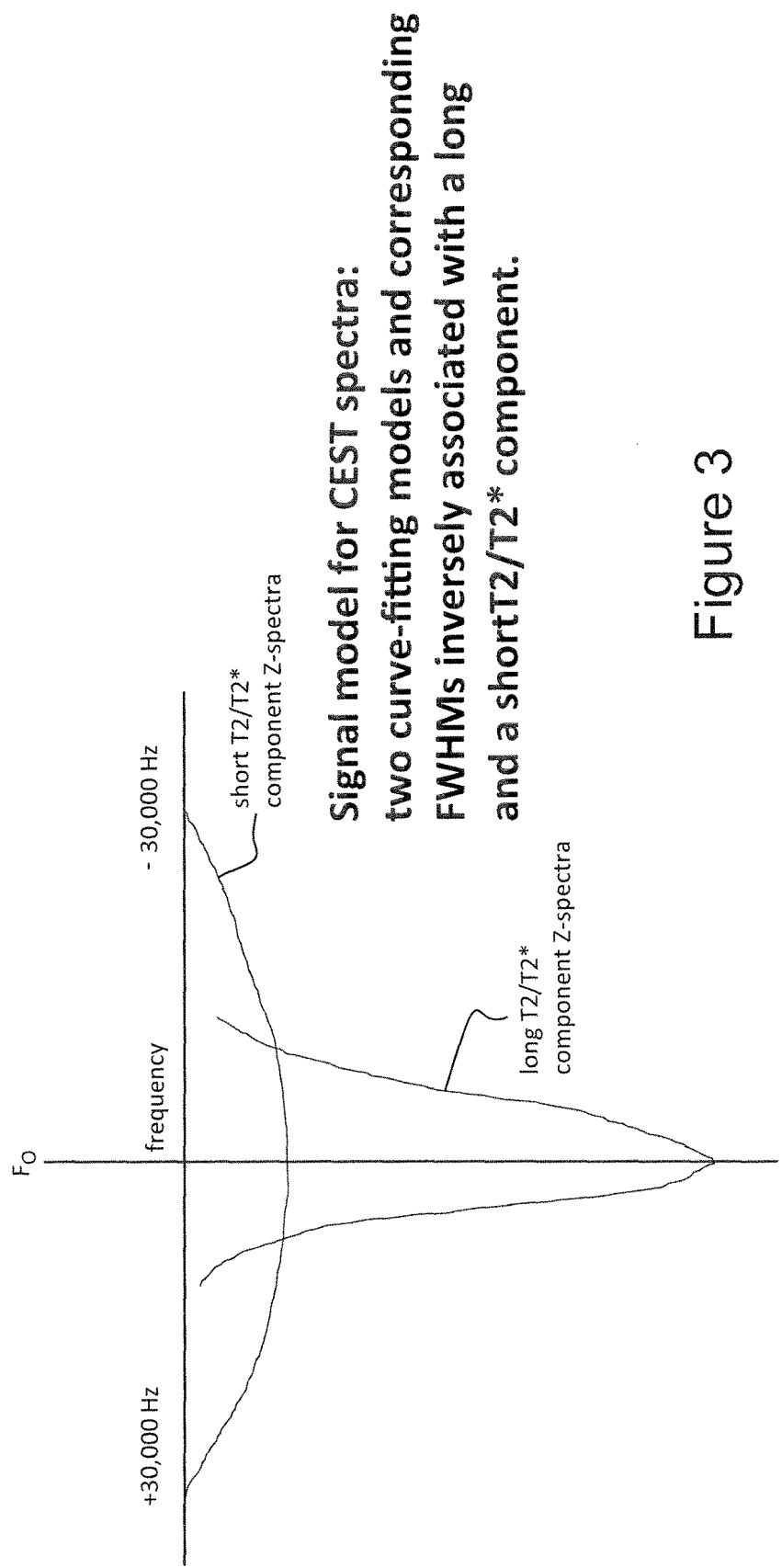
FIG. 3 is a graph depicting two curve-fitting models and their associated "long" and "short" FWHMs (e.g., corresponding to T2/T2*—or, more generally, T2e representing the T2 value of macromolecular nuclei participating in an MTC-effected exchange of NMR magnetization) components.
Figure 4:
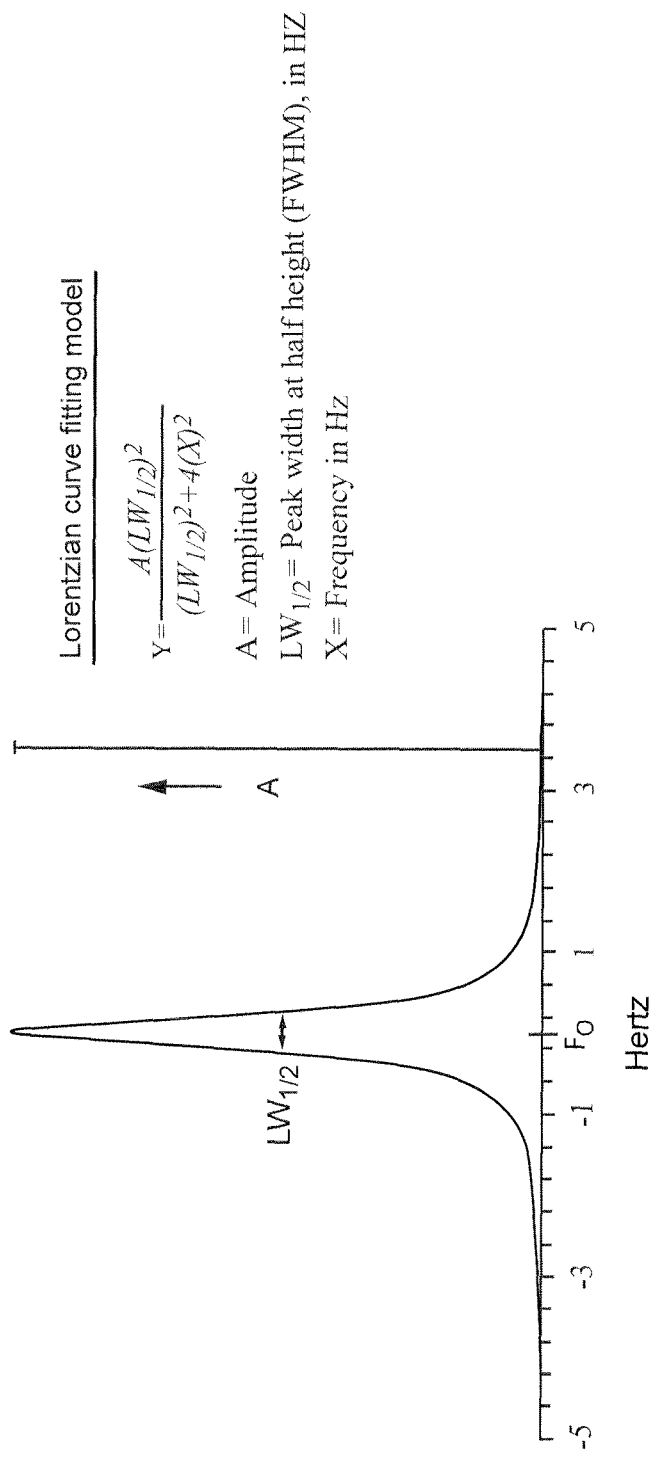
FIG. 4 is another graph of a spectral response curve fitting analysis for determining FWHM.

After data acquisition, MTC-related spectra of regions of interest are plotted and the FWHM parameters (e.g., $1/(FWHM/\pi)$ is proportional to, e.g., T2/T2* value for macromolecules) of those spectra are estimated. See, for example, FIG. 2 where the FWHM parameter of a spectral plot represents 1/T2 of a restricted or macromolecular environment. As shown in FIG. 3, signal modeling for MTC-related spectra may include two-component curve fitting models and FWHMs, namely to respectively simultaneously fit both "long" and "short" components (e.g., T1, T2, T2/T2*, etc.).

An exemplary embodiment allows for automated acquisition of MTC-related spectra with a proper desired frequency range, increment of offset frequency and output of MTC-related spectra. After collecting all image data, spectra for voxels of a region of interest (ROI) are calculated from all acquired images. Differentiation and contrast of normal versus abnormal tissue environments can become visually obvious from the acquired and processed images.

Contrary to traditional Z-spectrum acquisitions in which the offset frequencies usually range between −6 to 6 ppm, in our experiments, we selected a protocol with MT saturation using an expanded range of off-resonance frequencies from −30 KHz to 30 KHz. Fifty-three steps of offset frequencies (3 T) were applied: [30000,28000:−3000:1000,750:−50:−750,−1000:−3000:−28000,−30000] Hz. To improve the MTC pulse profile, ten sinc pulses with time bandwidth product of eight were implemented in our sequence. The RF pulse duration was 40 ms each. The MTC pulses were inserted as preparation pulses into an FASE 2D base imaging sequence, with TR/TE=8553/60 ms. The flip and flop angles were 90° and 90°, respectively. The in-plane resolution is 1.0 mm×1.1 mm, and the slice thickness is 5 mm. One single imaging slice was acquired for each human subject. Therefore, the total acquisition time for each subject was around ten minutes. For all nine subjects, the imaging slide was placed axially just below the body of corpus callosum. For one of the nine subjects, two more acquisitions were performed at two different imaging positions: one located axially and passed through the third ventricle (at the basal ganglia level); the other one was placed tilted through the cerebellum. The purpose of these two experiments is to confirm that the method proposed in our study was robust to imaging locations.

An exemplary embodiment provides a GUI for acquiring Z-spectra which includes acquisition of Z-spectra images, Z-spectra and calculation of a full width at half maximum (FWHM) parameter of the Z-spectra. The acquisition can be controlled by a selectable spectral width, a selectable increment of off-resonance frequency (e.g., 500 Hz increments from −30,000 Hz to +30,000 Hz, or a smaller increment near $F_0$ with larger increments at frequency offsets >±5,000 Hz). For example, in one embodiment there might be 53 data points acquired by using the following frequency offsets having varying incremental differences there between (e.g., using increments of 2 KHz, 3 KHz, and 50 Hz) with smaller increments towards the middle of the overall −30 KHz to +30 KHz range so that acquired data points are more concentrated near the mid range where spectral peaks are expected:

−30 KHz; −28 KHz; −25 KHz; −22 KHz; −19 KHz; −16 KHz; −13 KHz;

−10 KHz; −7 KHz; −4 KHz; −1 KHz; −750 Hz; −700 Hz; −650 Hz;

−600 Hz; −550 Hz; −500 Hz; −450 Hz; −400 Hz; −350 Hz; −300 Hz;

−250 Hz; −200 Hz; −150 Hz; −100 Hz; −50 Hz; 0 Hz; +50 Hz;

+100 Hz; +150 Hz; +200 Hz; +250 Hz; +300 Hz; +350 Hz;

+400 Hz; +450 Hz; +500 Hz; +550 Hz; +600 Hz; +650 Hz;

+700 Hz; +750 Hz; +1 KHz; +4 KHz; +7 KHz; +10 KHz; +13 KHz;

+16 KHz; +19 KHz; +22 KHz; +25 KHz; +28 KHz; and +30 KHz.

The predetermined band of different offset frequencies for the MTC pulses are here much larger than for conventional chemical exchange saturation transfer (CEST) analyses. In particular, the acquisition of MTC-related spectra needed for our exemplary embodiments acquires MR data sets across a relatively large range corresponding to expected macromolecular spectra. Ultra-short T2 values can thus be measured and curve-fitted for analysis. For example, for T2=50 μs, a bandwidth of 20 KHz (i.e., ±10 KHz) may be suitable, while for T2=10 μs, a bandwidth of 100 KHz (±50 KHz) would be more suitable.

The MRI data acquisition sequence itself can be virtually any desired sequence (e.g., FASE, EPI, bSSFP, FFE, FE, FSE, SE, etc.), including 2D and 3D sequences. Each image data set for a selected ROI gives MTC-related spectra and FWHMs. After acquiring the spectra, FWHMs of any specified area of the ROI can be calculated to provide, e.g., two T2/T2* values (e.g., long and short ranges) for the macromolecule environments. After collecting all image data, FWHM or tissue values (e.g., T2/T2*) in the region of interest (ROI) are calculated from the acquired images. Preferably, the k-space data is acquired over the designated spectral width as MRI data sets from the same sequence or linked sequences while maintaining substantially constant RF signal receiver gain.

Curve fitting of at least two components (e.g., long and short) in the MTC-related spectra provides short and long T2 components with overlay of T2 amounts on the obtained images. The FWHMs (or, e.g., T2/T2*) of typical expected normal values (short and long) at each organ in normal variation can be used as a reference, while different FWHM (or, e.g., T2/T2*) values can be used to indicate diseased areas.

One possible curve fitting model that has been suggested by others uses a Lorentzian line shape (as depicted in FIG.

4). Since we hypothesize that there are at least two exchangeable proton pools, our two-component model can be described by Equation 1:

$$y = \left( A_1 \frac{LW_1^2}{LW_1^2 + 4x^2} + A_2 \frac{LW_2^2}{LW_2^2 + 4x^2} \right) \quad \text{[Equation 1]}$$

y: normalized measured Z-spectrum
x: offset frequency (−30 to 30 KHz) of MTC pulses
$A_{1/2}$: amplitudes of the long/short T2 exchangeable components
$LW_{1/2}$: FWHMs of the long/short T2 components (and are inversely proportional to T2 values).

To extract the information on two exchangeable proton components, i.e., to estimate $A_{1/2}$ and $LW_{1/2}$, the acquired MT images are curve-fitted to the signal model in Equation 1 using the lsqnonline function in MATLAB (Math Works, Inc. Natick, Mass.), which solves non-linear least-squares problems. We processed the data in two different ways: in the first approach, three regions of interest (ROIs), i.e., the grey matter, white matter and cerebrospinal fluid (CSF) were segmented in SPM8 (Statistical Parametric Mapping, www-.fil.ion.ucl.ac.uk/spm/). The mean signal in each ROI was calculated and then served as input in Equation 1. In the second approach, the signal was curve-fitted using the Lorentzian lineshape in a voxel-by-voxel fashion.

Figure 5:
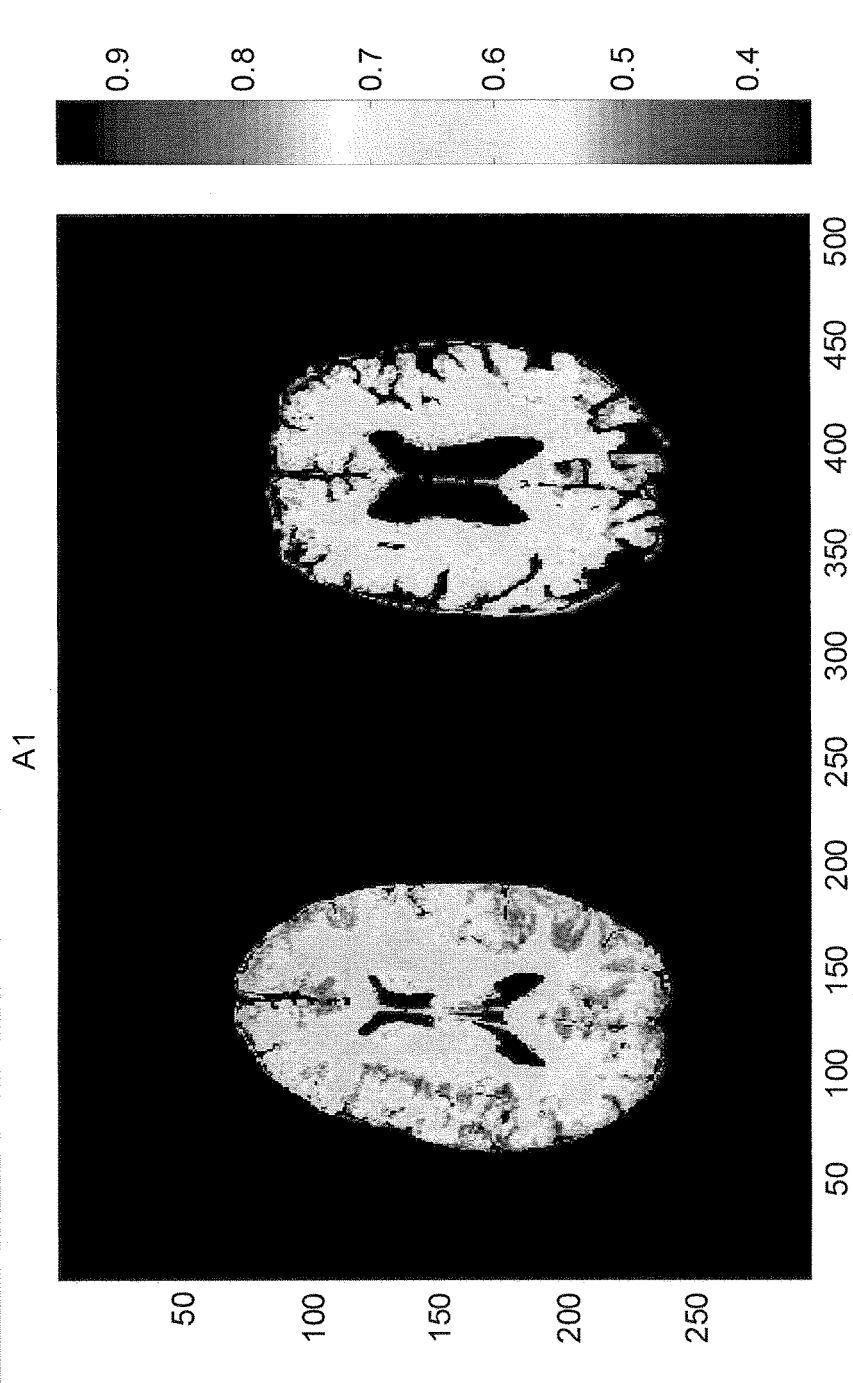
FIG. 5 presents images for young and senior volunteers showing relative amplitudes of the long T2/T2* pool.

Amplitudes of a "long" T2/T2* pool for young and senior volunteers are depicted in FIG. 5.

Figure 6:
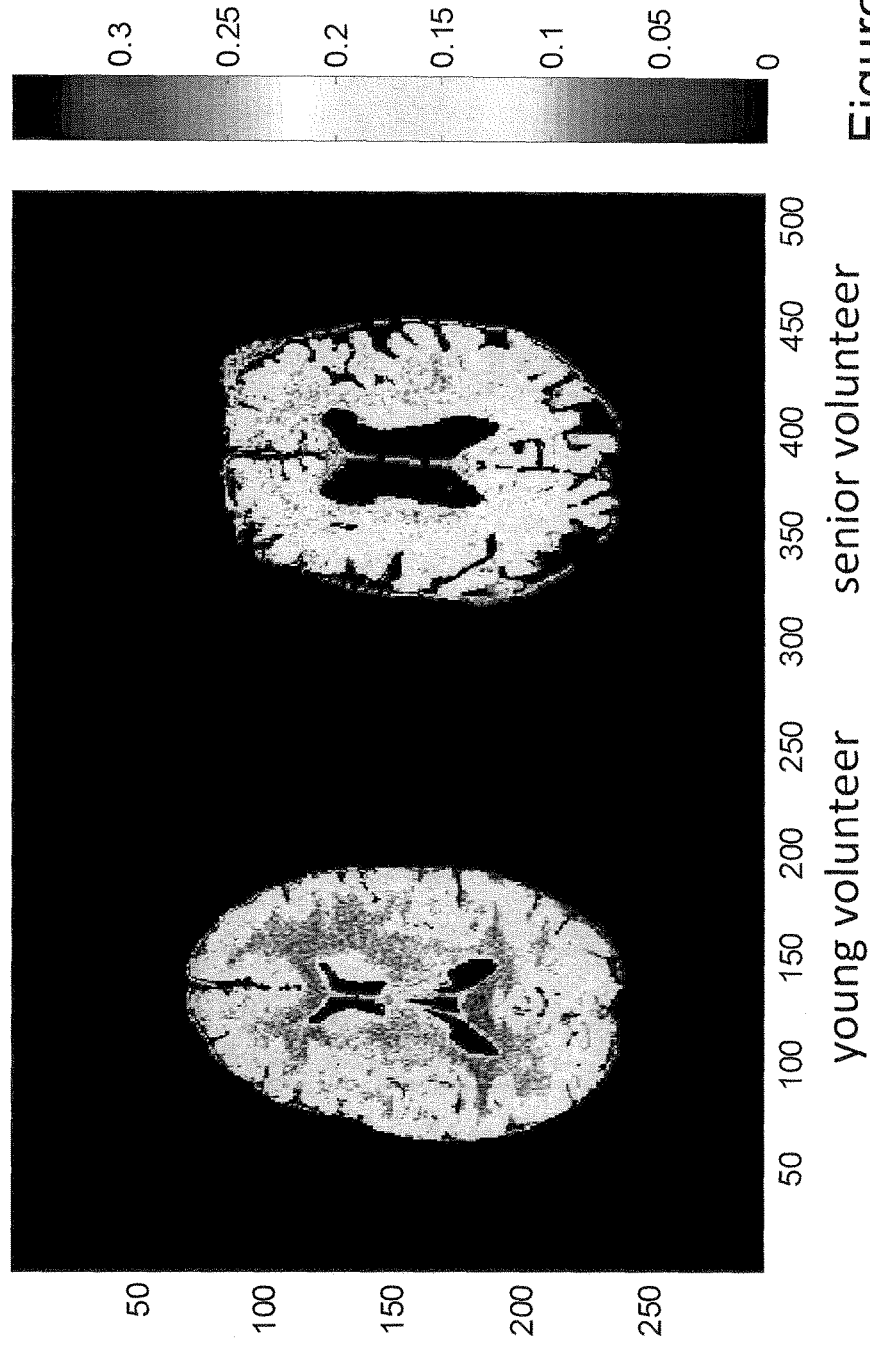
FIG. 6 similarly depicts images showing relative amplitudes of ultra-short T2/T2* pool for the young and senior volunteers.

Amplitudes of an ultra "short" T2/T2* pool for young and senior volunteers are depicted in FIG. 6.

An example result of curve fitting and parameter extraction is shown in Table 1 below (where GM=grey matter and WM=white matter):

TABLE 1

| Subjects | | A1 | LW₁ (Hz) | T2* (µs) | A2 | LW₂ (Hz) | T2* (µs) |
|---|---|---|---|---|---|---|---|
| Young | GM | 0.77 | 368 | 863.9 | 0.13 | 11426 | 27.9 |
| | WM | 0.69 | 426 | 747.0 | 0.23 | 10081 | 31.6 |
| Senior | GM | 0.69 | 329 | 968.0 | 0.10 | 19362 | 16.4 |
| | WM | 0.68 | 409 | 777.4 | 0.18 | 7600 | 41.9 |

The example curve fitting result provides long T2* as a majority (around 70%) component, and short T2* as a minority (e.g., about 10-20%) component. The long T2* component of macromolecules shows a relatively high percentage in the grey matter, whereas the short T2* component shows a relatively higher portion in the white matter. In one embodiment, a "short" T2/T2* FWHM range may comprise values less than 40 µs while a "long" T2/T2* FWHM range may comprise values more than 40 µs.

Figure 7:
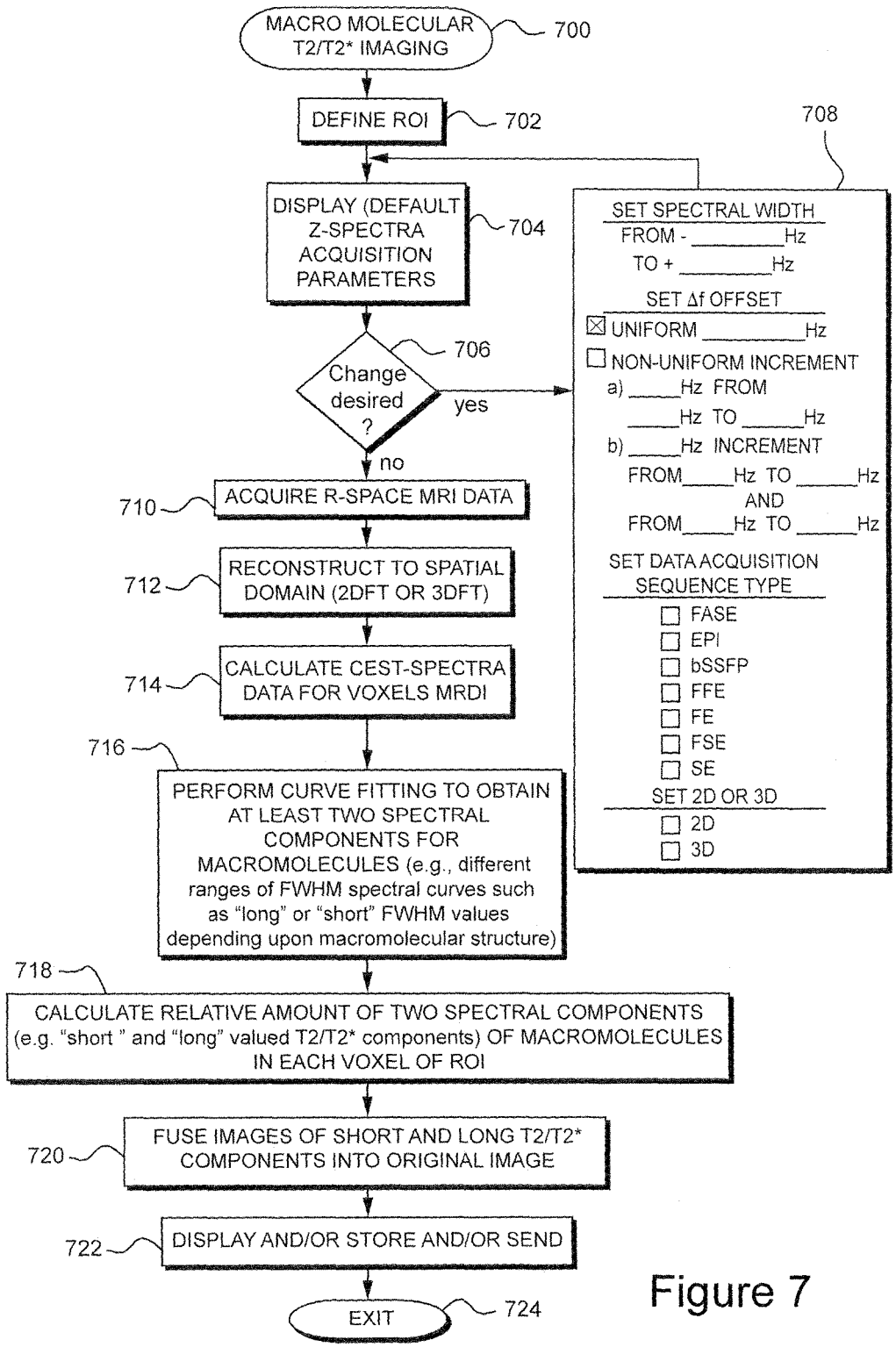
FIG. 7 is a schematic illustration of exemplary computer program code structure in the form of a flow chart for implementing an exemplary embodiment of automated MRI detection of tissue macromolecular T2/T2* characteristics using Z-spectra.

As depicted at FIG. 7, the macromolecular T2/T2* imaging routine is entered at 700. A desired ROI is defined conventionally at 702. Thereafter, at 704, a set of default spectra acquisition parameters may be displayed. Of course, the default may be set to either nominal or null values so as to require operator inputs as may be desired. In any event, at 706, the operator is given an opportunity to indicate whether changes in the displayed acquisition parameters are desired. If so, then control is passed to box 708 where the spectral width, increments of frequency offset (uniform or non-uniform in the exemplary embodiment depending upon different points or ranges in the frequency spectrum) are presented to the operator. In the exemplary embodiment, the operator is also given an opportunity to define which type of MRI data acquisition sequence is to be employed and whether 2D or 3D acquisition is to be employed. Once the operator has set the minimal required inputs at 708, then those are displayed again at 704 and the operator is given another chance to change the parameters if desired at 706.

Eventually, the acquisition parameters are set to the operator's satisfaction and control is then passed to 710 where k-space MRI data is acquired for each incremented offset frequency over the selected spectral bandwidth using the set data acquisition type of sequence, and whether 2D or 3D, etc. Once the MRI data has been acquired at each frequency (or possibly starting even concurrently with the acquisition of some later acquired data), processing passes to block 712 where acquired k-space MRI data is reconstructed to the spatial domain using 2DFT or 3DFT techniques known in the art. Thereafter, the acquired image data is processed at 714 so as to calculate spectra data for the ROI voxels. In the preferred exemplary embodiment, curve fitting techniques are used at 716 so as to identify at least two spectral components for macromolecules participating in the MTC magnetization exchange process. For example, different ranges of FWHM spectral curves such as "long" and "short" values may be defined reflecting different macromolecular structures participating in the CEST process. At 718, in the preferred embodiment, the relative amount of these two different spectral components are calculated for the ROI (e.g., possibly on a pixel-by-pixel basis which are then compared to find whether there are more short- or more long-valued components found in the pixels/voxels of the designed ROI).

At box 720 in FIG. 7, images of short and long T2/T2* components are fused onto an original MR image of the ROI. The resultant composite image is then displayed at 722 (or stored for later display and/or sent to some other location for similar display/storage). Ultimately, the sub-routine is exited at 724 and control is passed back to the calling higher level operating system or the like.

In above exemplary embodiments, T2/T2* has been used as an example MTC-related NMR parameter linked to MTC-affected exchangeable protons. However, other MTC-affected parameters (e.g., T1, T2, etc.) may also be measured. For example, the T2 values for exchangeable protons participating in MTC might be identified by "T2e" or other desired nomenclature.

From the above, it should be understood that abnormal tissues (e.g., cancer cells) will have different CEST spectra (or Z-spectra) from those of normal tissues.

However, in addition, it should be understood that the expected range of T2e values (and hence the bandwidth of offset frequencies used for data acquisition) may also change as a function of the targeted anatomy (e.g., kidney, liver, etc.).

Nine volunteers (seven males and two females; age range 33-71 years old and mean age 47 years old) underwent the wide-ranged Z-spectrum experiment of the brain. MR experiments were performed on a 3 T system (Toshiba, Titan 3 T) using a standard body coil transmission and a twelve (or eight)-channel head array receive coil, following a protocol approved by the Institutional Review Board of the institute. Padding was used to stabilize the subject's head and to reduce movement.

Figure 8A:
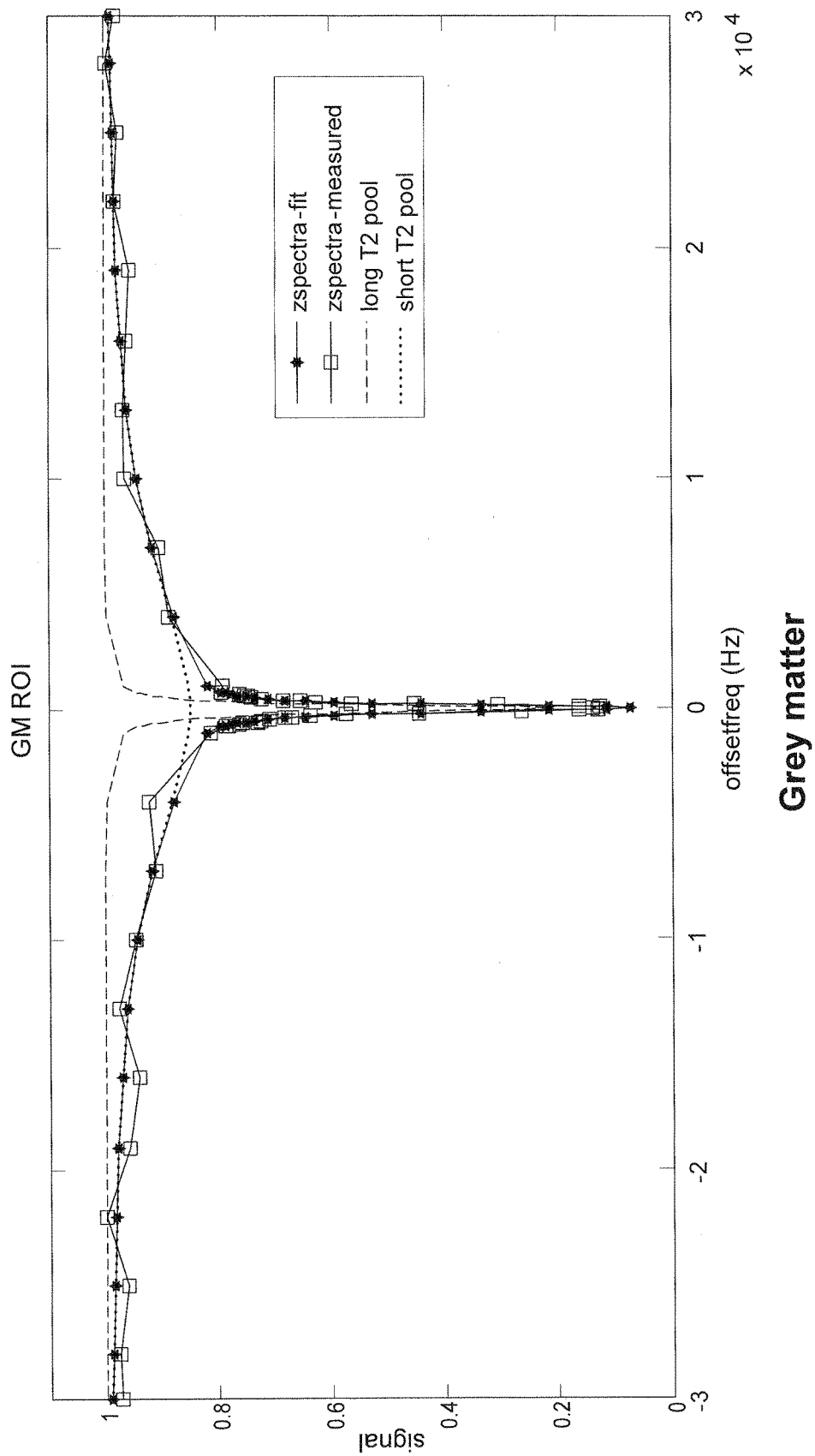
FIGS. 8a-8b depict Z-spectra of grey and white matter and curve fitting in exchangeable protons of short T2es and long T2el.
Figure 8B:
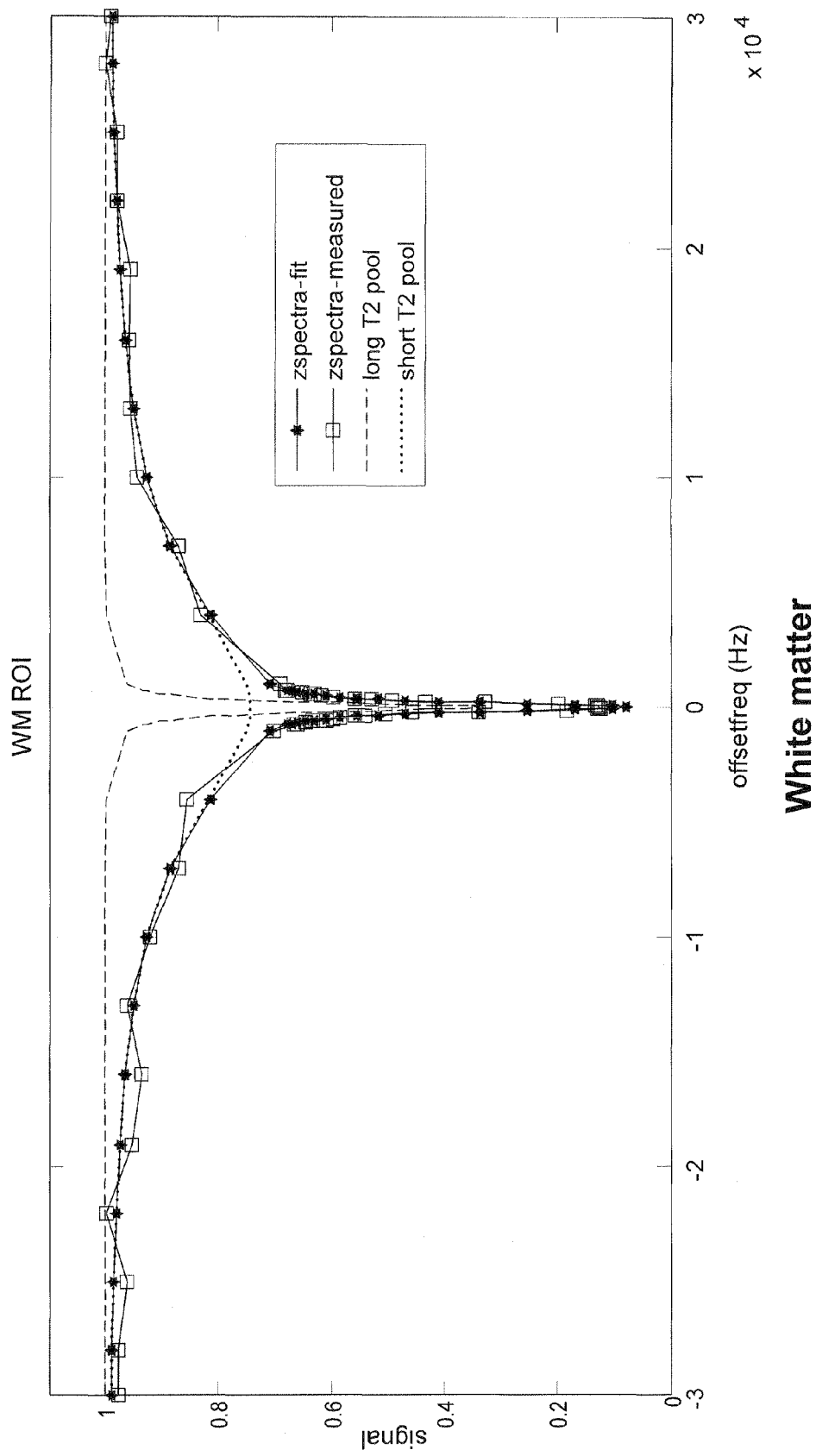
Figure 9A:
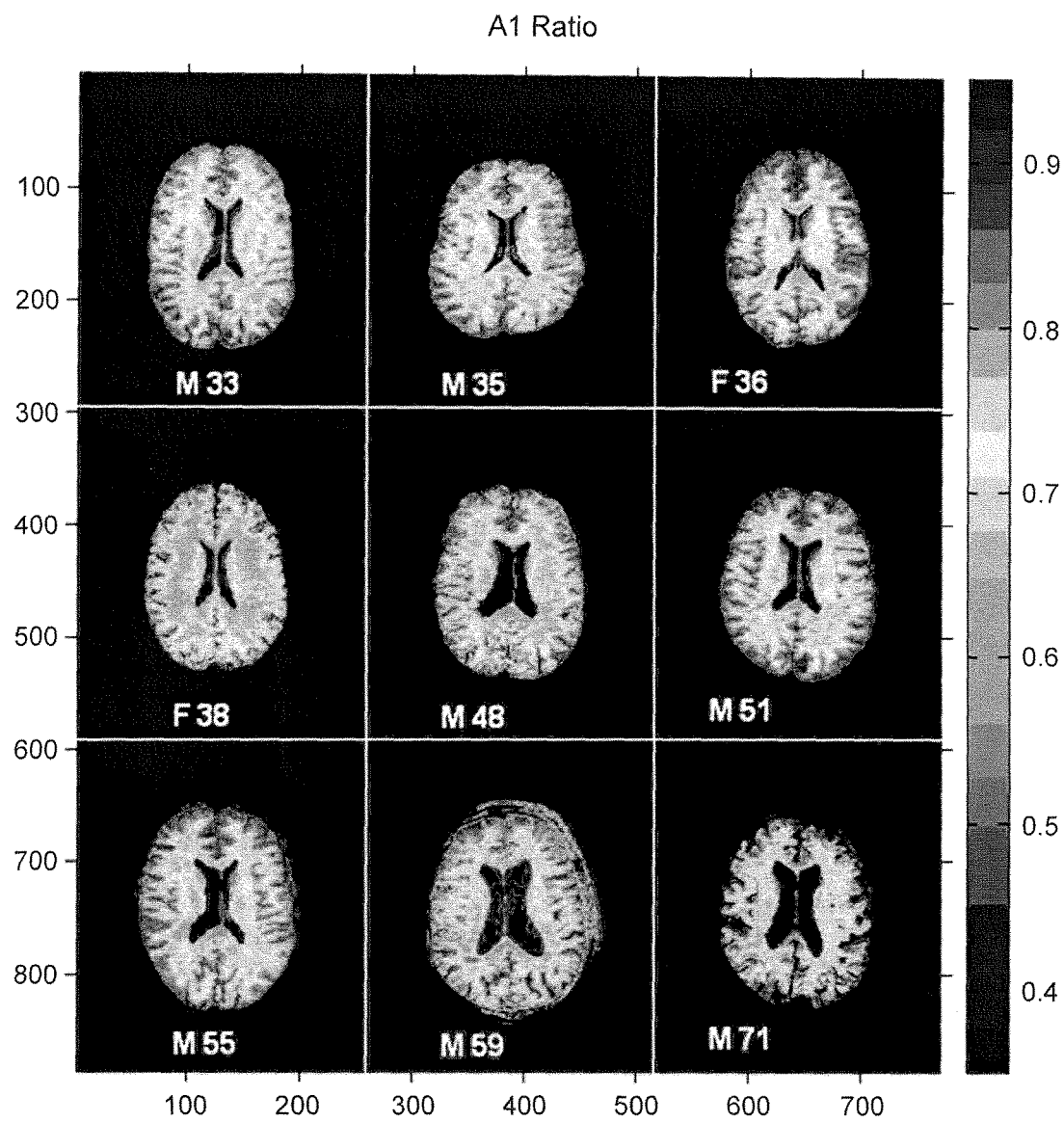
FIGS. 9a-9d depict color maps of nine healthy volunteers: (a) T2el, b) T2es, c) T2el HWFM, and d) T2es HWFM.
Figure 9B:
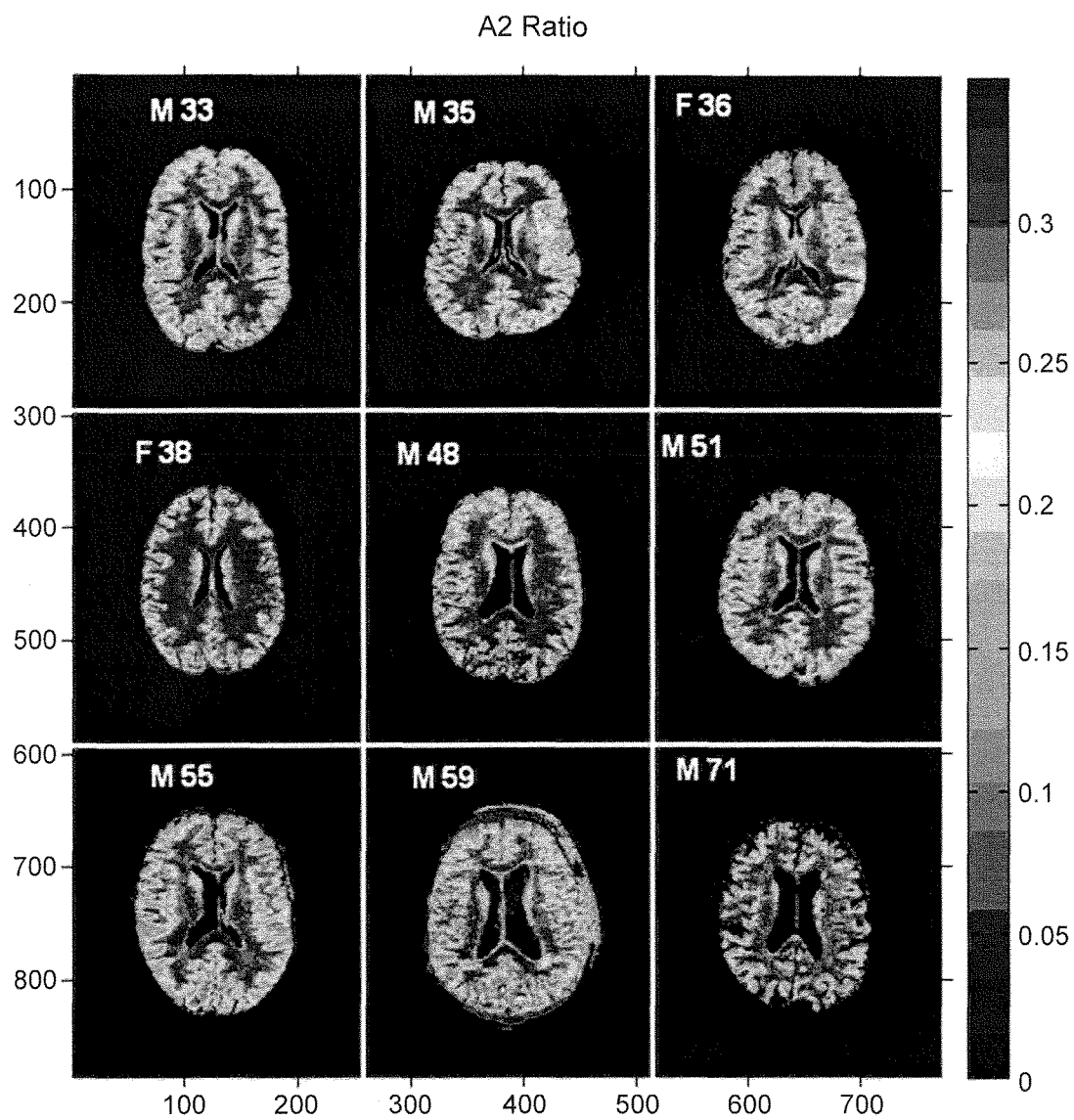
Figure 9C:
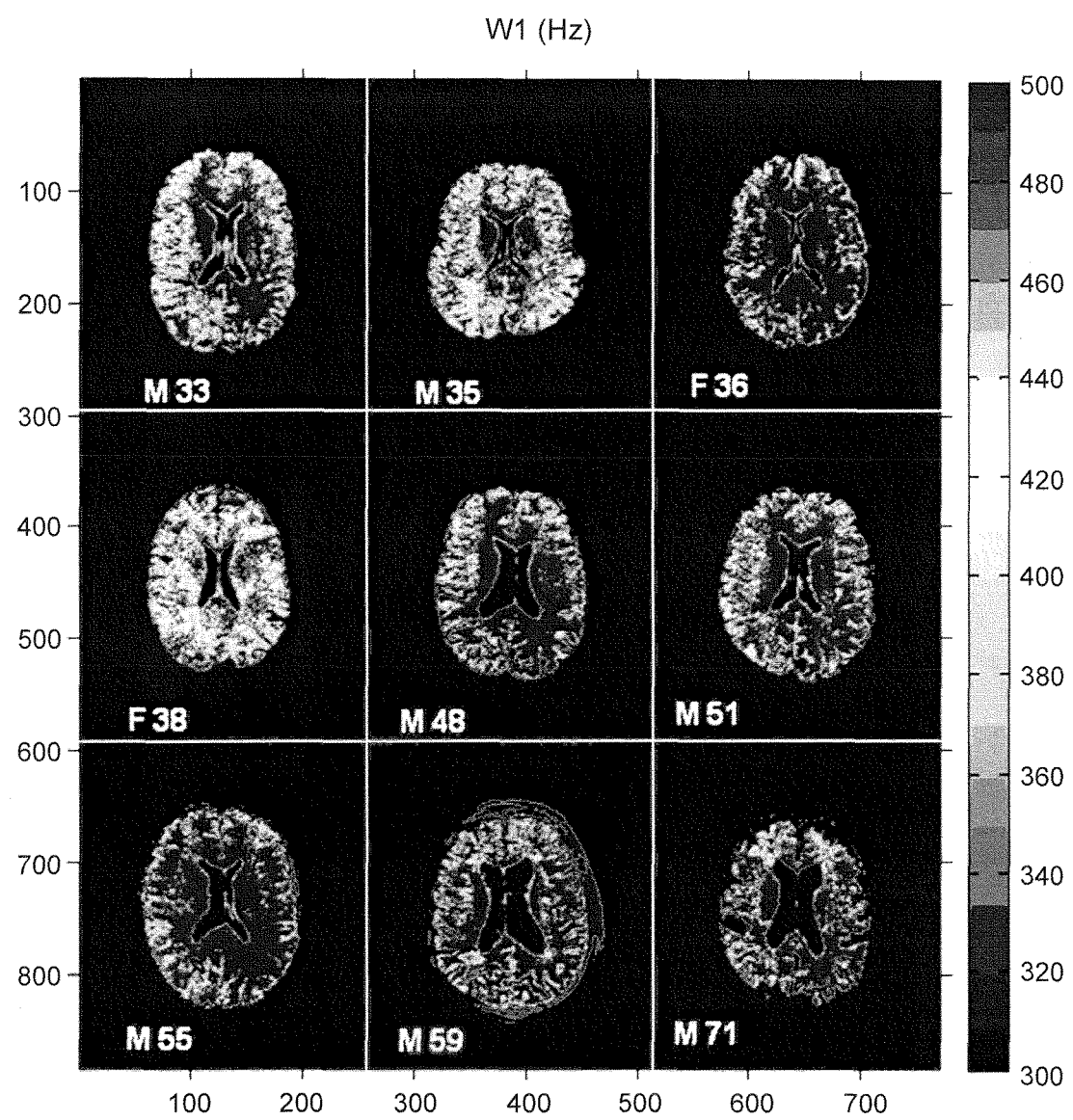
Figure 9D:
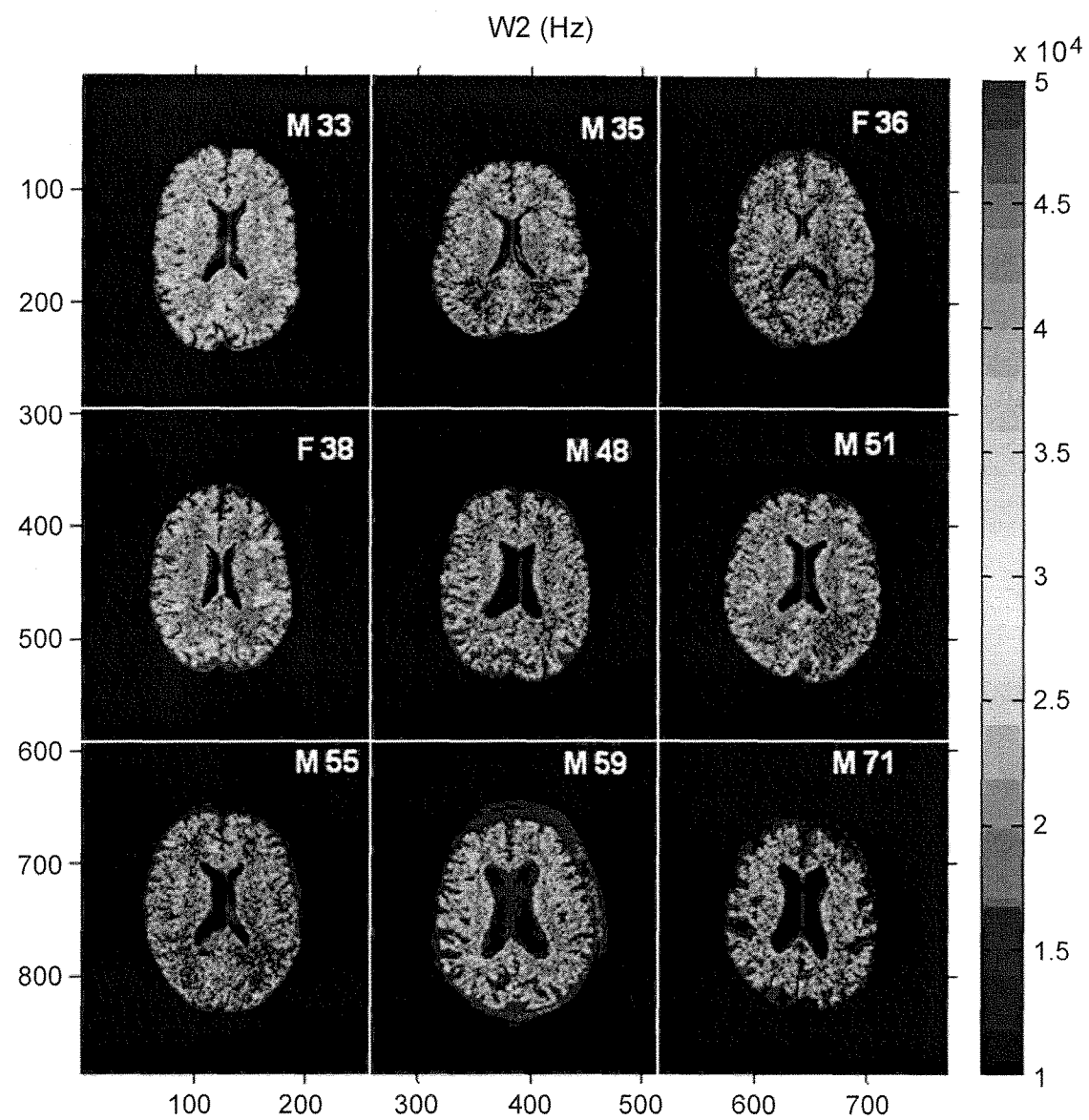

The grey and white matter were successfully segmented for all nine subjects. FIGS. 8a-8b show an example of the curve-fitting results of the T2el and T2es components, in both grey matter (FIG. 8a) and white matter (FIG. 8b) on one volunteer. On curve stands for the acquired Z-spectrum, and the other one is a fitted Z-spectrum using the Lorentzian model. The long T2 and short T2 components are shown separately. The measured mean signal in grey matter and white matter are well fitted for all 9 volunteers. In FIGS. 8a-8b, measured Z-spectra data points are plotted using a square while the curve-fitted result data points are plotted using a filled-star. The grey matter and white matter include two exchangeable proton components, short T2es (shown with dotted line in FIGS. 8a-8b) and long T2el (shown with dashed lines in FIGS. 8a-8b).

FIGS. 9a-9d represent ratios of T2el (FIG. 9a) and T2es (FIG. 9b), and FWHM (FIGS. 9c and 9d) values in each voxel in nine volunteers. The age of each subject is labeled below each image. The calculated average values of T2el and T2es, and FWHMs of T2el and T2es of the grey and white matter in all nine volunteers, are tabulated in Table 2. The grey matter consists of about 83% T2el and 17% T2es, while the white matter shows 72% T2el and 28% T2es. The percentages of long and short T2 environments in the grey matter are similar for all ages, whereas that of the short T2es component decreases with age.

Figure 10B:
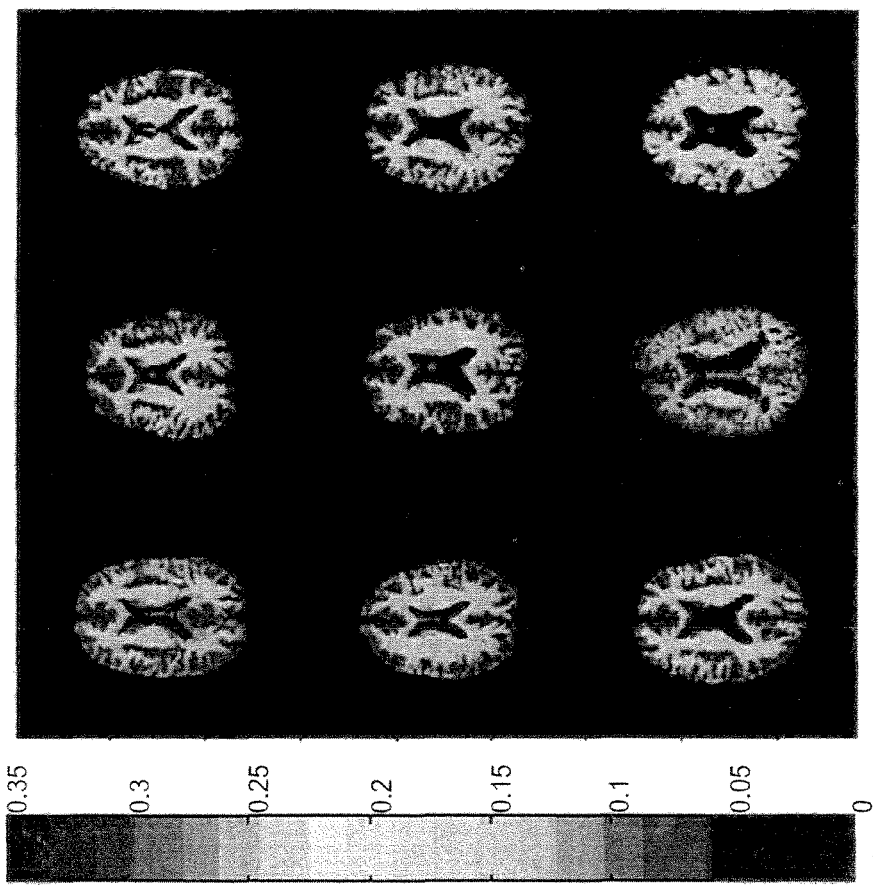
FIGS. 10a-10b present a comparison of T2es weighted contrast images (10a) with imaged segments of grey and white matter (10b)
Figure 10A:
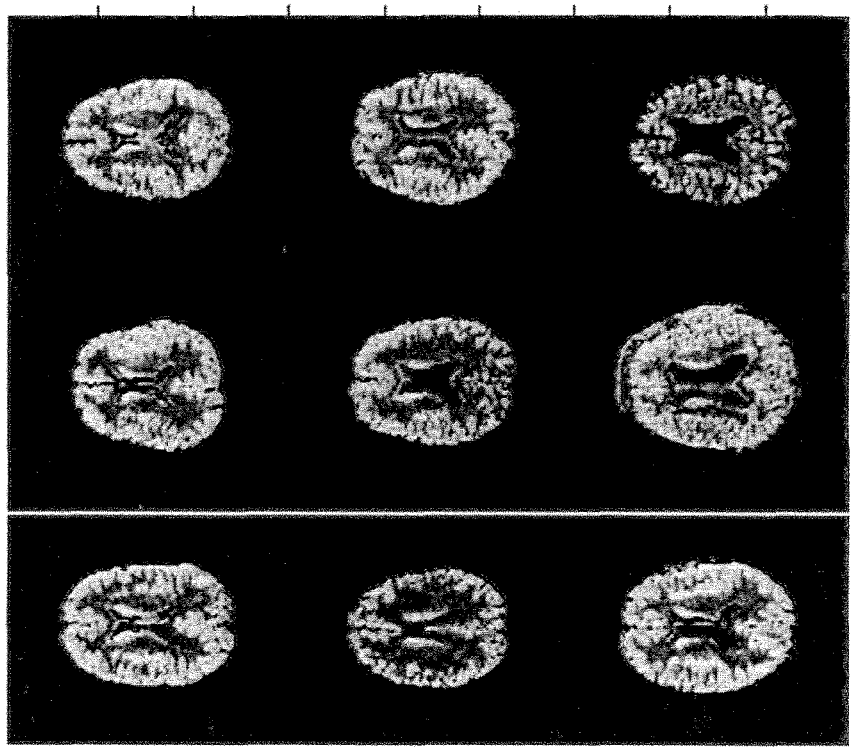
Figure 11:
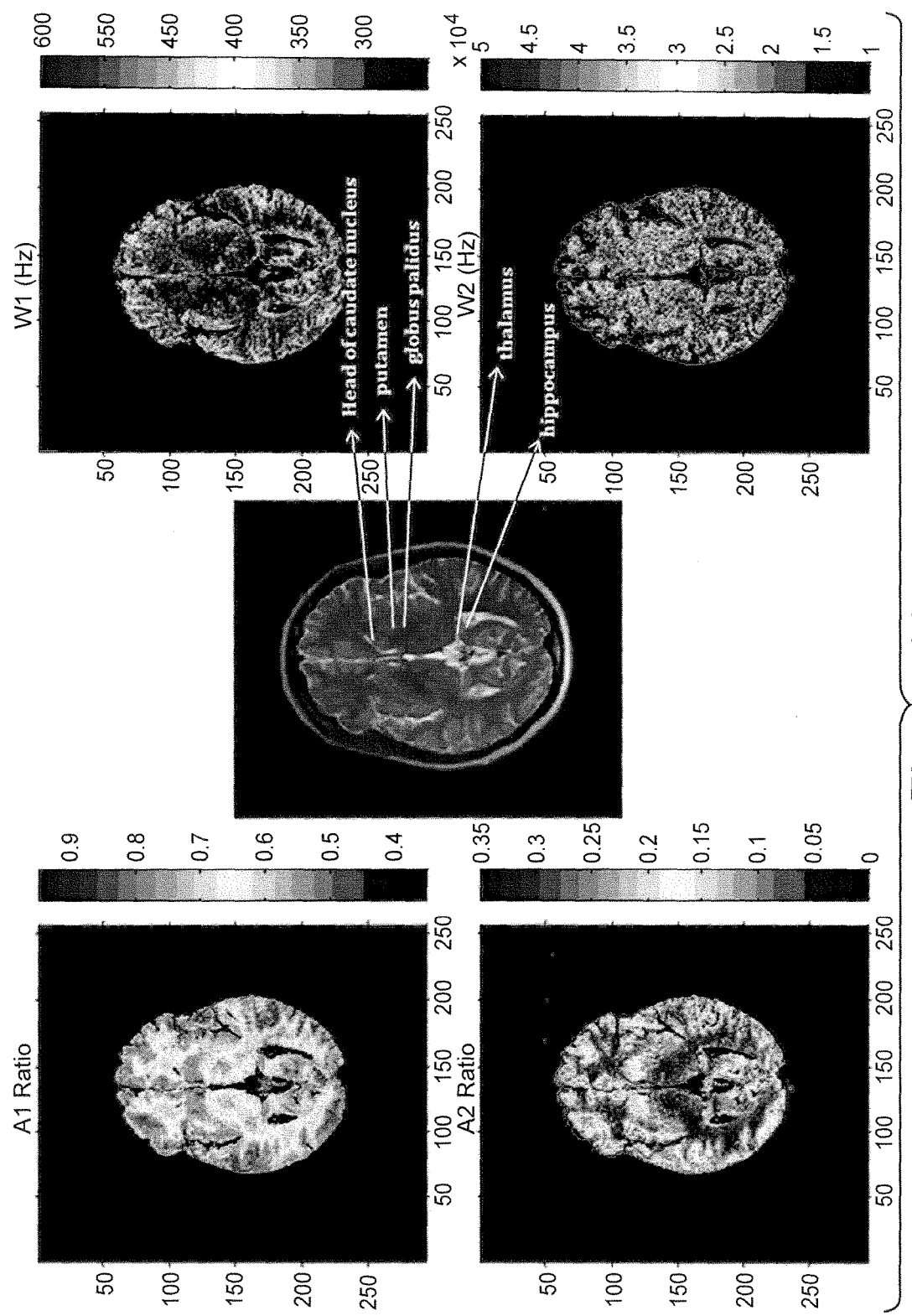
FIG. 11 depicts curve fitted T2el (upper left), T2es (lower left), FWHM of T2el (upper right), and FWHM of T2es (lower right) of the basal ganglia region also depicted in the center reference image (five different brain tissues are labeled: caudate nucleus, putamen, globus pallidus, thalamus and hippocampus)
Figure 12:
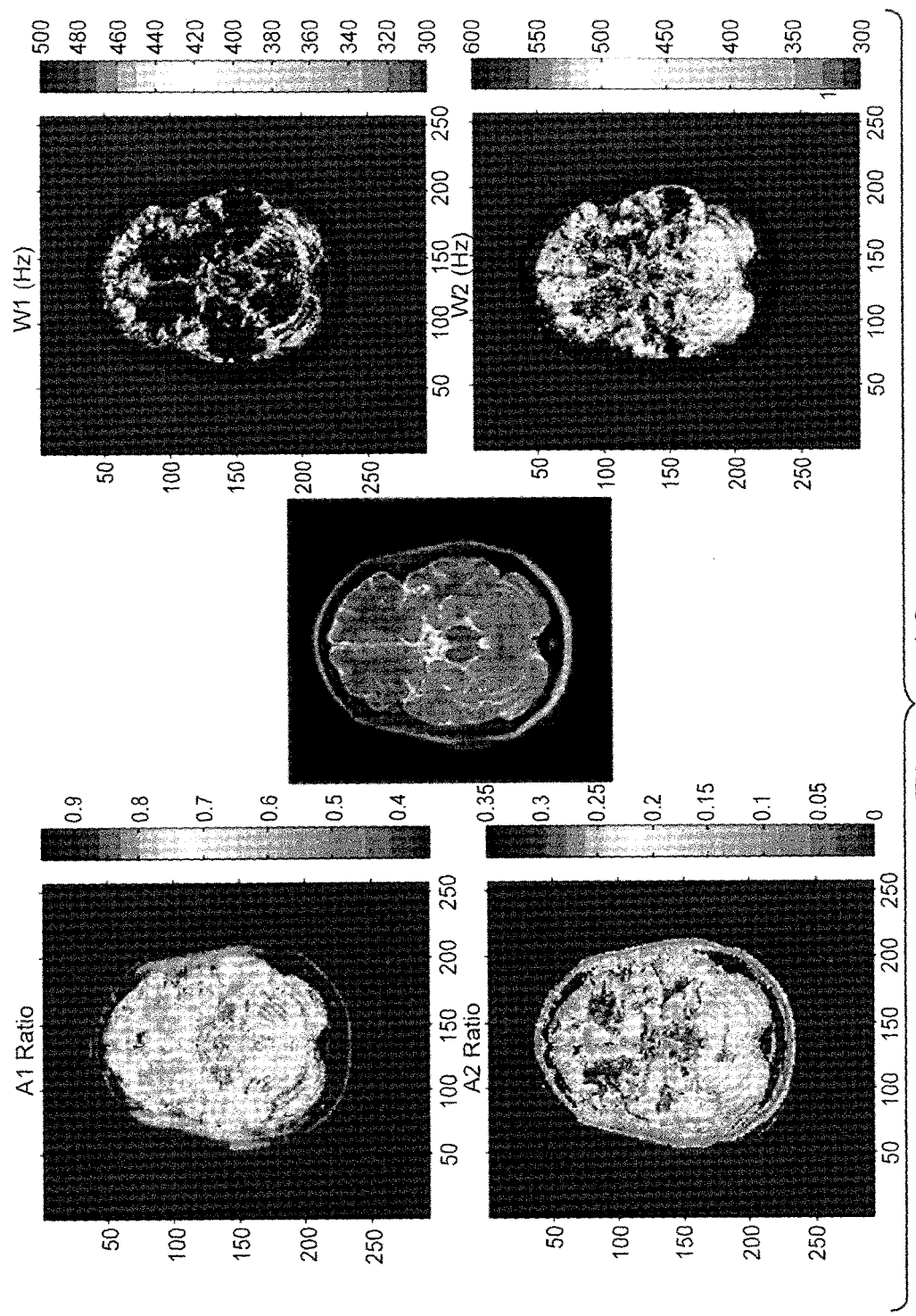
FIG. 12 depicts curve fitted T2el (upper left), T2es (lower left), FWHM of T2el (upper right), and FWHM of T2es (lower right) of the cerebellum region also shown in a center reference image.

FIGS. 10a-10b demonstrate contrast between grey matter and white matter in T2el-weighted images, which is in good agreement with GM and WM segmented images. FIGS. 11 and 12 show the curve-fitted results, i.e., $A_{1/2}$ and $LW_{1/2}$ maps, at basal ganglia and cerebellum levels, respectively. Five different brain regions are labeled in FIGS. 11-12: caudate nucleus, putamen, globus pallidus, thalamus and hippocampus. Excellent contrast and image quality were obtained at these two locations as well.

TABLE 2

| Subjects | Gender | Age | A1 | LW1 (Hz) | T2* (μs) | A2 | LW2 (Hz) | T2* (μs) |
|---|---|---|---|---|---|---|---|---|
| WM: | | | | | | | | |
| 1 | M | 33 | 0.71 | 489 | 651.2302 | 0.29 | 18099 | 17.6025 |
| 2 | M | 35 | 0.71 | 463 | 687.9950 | 0.29 | 14467 | 21.9952 |
| 3 | F | 36 | 0.72 | 511 | 623.0598 | 0.28 | 11264 | 28.2659 |
| 4 | F | 38 | 0.69 | 441 | 722.1178 | 0.31 | 16319 | 19.5124 |
| 5 | M | 48 | 0.70 | 492 | 647.2513 | 0.30 | 13051 | 24.3825 |
| 6 | M | 51 | 0.73 | 488 | 651.9305 | 0.27 | 11907 | 26.7380 |
| 7 | M | 55 | 0.72 | 511 | 622.5505 | 0.28 | 11720 | 27.1518 |
| 8 | M | 59 | 0.76 | 443 | 719.1257 | 0.24 | 15302 | 20.7856 |
| 9 | M | 71 | 0.77 | 443 | 717.9161 | 0.23 | 12964 | 24.5417 |
| Mean | | 47.33 | 0.72 | 475.67 | 671.4652 | 0.28 | 13899.22 | 23.4403 |
| SD | | 12.95 | 0.03 | 28.70 | 40.8996 | 0.03 | 2319.49 | 3.6860 |
| GM: | | | | | | | | |
| 1 | M | 33 | 0.83 | 396 | 803.6688 | 0.17 | 27239 | 11.6820 |
| 2 | M | 35 | 0.82 | 390 | 815.2553 | 0.18 | 17330 | 18.3665 |
| 3 | F | 36 | 0.84 | 456 | 698.4356 | 0.16 | 13557 | 23.4913 |
| 4 | F | 38 | 0.79 | 403 | 789.4085 | 0.21 | 23614 | 13.4645 |
| 5 | M | 48 | 0.83 | 417 | 762.6705 | 0.17 | 22600 | 14.0693 |
| 6 | M | 51 | 0.86 | 396 | 803.8598 | 0.14 | 16792 | 19.0986 |
| 7 | M | 55 | 0.83 | 455 | 699.3268 | 0.17 | 14769 | 21.5496 |
| 8 | M | 59 | 0.85 | 393 | 808.9209 | 0.15 | 21269 | 14.9606 |
| 9 | M | 71 | 0.82 | 362 | 879.9995 | 0.18 | 14294 | 22.2817 |
| Mean | | 47.33 | 0.83 | 407.56 | 784.6148 | 0.17 | 19051.56 | 17.6630 |
| SD | | 12.95 | 0.02 | 30.76 | 57.6268 | 0.02 | 4803.55 | 4.2813 |

We have demonstrated that the short T2es and long T2el values of exchangeable protons in the human brain are matched with grey and white matter segments. The grey and white matter presents higher content of T2el than T2es. The short T2es content was higher in the white matter than the grey matter. One reason we observed more short T2es in the white matter could be due to the myelin sheath, which restricts the molecular movement by the layer of sheath. The basal ganglia indicate similar T2e components of the grey and white matter. The cerebellum shows complicated grey and white matter layers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) system comprising:
   an MRI gantry having static and gradient magnet assemblies and at least one radio frequency (RF) coil defining an image volume into which a patient region of interest (ROI) can be disposed;
   MRI control circuits connected to control components within said MRI gantry and configured to effect MRI data acquisition sequences of RF and gradient magnetic pulses and thereby elicit MRI signals from patient tissue when the patient ROI is disposed therein, the MRI control circuits also being configured to acquire and process said elicited MRI signals, in at least one processor, into MR image data;
   said at least one processor and MRI control circuits being configured to:
   (a) acquire k-space data from the patient ROI over a predetermined band of RF frequencies using the at least one RF coil and RF excitation pulses having respectively corresponding RF frequencies that are incrementally offset from a nuclear magnetic resonant (NMR) Larmor frequency of free nuclei over a predetermined range of different offset frequencies in which target macromolecule responses are expected;
   (b) analyze the acquired k-space data with the at least one processor in order to provide spectral peak width data of the patient ROI that represents macromolecules participating in the magnetization transfer contrast (MTC) effects; and (c) store and/or display, with a memory and/or a graphical user interface (GUI) connected to the at least one processor, the provided spectral peak width data that is representative of the MRI signals elicited from patient tissue in the patient ROI having macromolecules participating in said MTC effects.

2. An MRI system as in claim 1, wherein said provided spectral peak width data provided is based on a calculation of full width half maximum (FWHM) values.

3. An MRI system as in claim 2, wherein said at least one processor and MRI control circuits are configured to distinguish between FWHM values associated with normal tissue or FWHM values associated with diseased tissue.

4. An MRI system as in claim 3, wherein said at least one processor and MRI control circuits are further configured to define at least two ranges of FWHM values comprising a first range of FWHM values that is larger than a second range of FWHM values, whereby one of said first or second ranges is associated with diseased tissue and another of said ranges is associated with normal tissue.

5. An MRI system as in claim 4, wherein at least one processor and said MRI control circuits are configured to detect a short FWHM value of
 (a) less than 500 microseconds, while corresponding to a frequency range of ±1,000 Hz and
 (b) less than 50 microseconds, while corresponding to a frequency range of ±10,000 Hz.

6. An MRI system as in claim 1, wherein at least one processor and said MRI control circuits are further configured to provide a graphical user interface (GUI) that provides an operator with the choice of the spectral bandwidth as well as increments of frequency offset that are to be used in acquiring the k-space data of the patient tissue, in the patient ROI, as data sets from a single MRI RF excitation pulse sequence, or a series of linked MRI RF excitation pulse sequences, with a substantially constant receiver gain.

7. An MRI system as in claim 6, wherein said GUI provides the operator with a choice of non-uniform increments with respect to the frequency offset.

8. An MRI system as in claim 1, wherein at least one processor and said MRI control circuits are further configured to analyze the acquired k-space data by performing, with the at least one processor, a curve fitting onto the acquired k-space data points.

9. An MRI system as in claim 1, wherein said at least one processor and MRI control circuits are further configured to overlay pixel data representing said MTC effects of the provided spectral peak width data in the patient ROI respectively onto the corresponding pixels of a reconstructed MR image.

10. An MRI system as in claim 1, wherein said at least one processor and MRI control circuits are further configured
 to calculate for the patient tissue, in the patient ROI:
  (a) a first range of spectral peak width data and
  (b) a second range of spectral peak width data, and
 to generate a magnetic resonance image (MRI) the patient tissue, in the patient ROI with tissues being displayed differently corresponding to either the calculated first range or the calculated second range.

11. An MRI system as in claim 10, wherein said at least one processor is further configured to generate a magnetic resonance image (MRI) of the patient tissue, in the patient ROI, with one of two tissues, in the generated MRI being displayed differently based on whether said calculated first range or the calculated second range, is above or below a predetermined threshold.

12. A magnetic resonance imaging (MRI) method comprising:

(a) acquiring with at least one processor k-space data of a patient tissue region of interest (ROI) over a predetermined band of RF frequencies using the at least one RF coil and RF excitation pulses having respectively corresponding RF frequencies that are incrementally offset from a nuclear magnetic resonant (NMR) Larmor frequency of free nuclei over a predetermined range of different offset frequencies in which target macromolecule responses are expected;

(b) analyzing the acquired k-space data with the at least one processor in order to provide corresponding spectral peak width data in the patient tissue ROI that represent macromolecules participating in the magnetization transfer contrast (MTC) effects; and (c) storing and/or displaying, with a memory and/or a graphical user interface (GUI) connected to the at least one processor, the provided spectral peak width data that is representative of the MRI signals elicited from patient tissue in the patient ROI having macromolecules participating in said MTC effects.

13. An MRI method as in claim 12, wherein said provided corresponding spectral peak width data is provided based on a calculation of full width half maximum (FWHM) values.

14. An MRI method as in claim 13, wherein said FWHM values are used by the at least one processor in order to distinguish between normal tissue and diseased tissue.

15. An MRI method as in claim 14, wherein the least one processor defines at least two ranges of FWHM values comprising a first range of FWHM values that is larger than a second range of FWHM values, whereby one of said first or second ranges is associated with diseased tissue and another of said ranges is associated with normal tissue.

16. An MRI method as in claim 15, wherein said first range of FWHM values is larger than 100 µs and said second range of FWHM values is less than 100 µs.

17. An MRI method as in claim 15, wherein at least one processor defines said second range as comprising a FWHM value range of less than 500 microseconds, while corresponding to a frequency range of ±1,000 Hz and the at least one processor also defines said first range as comprising a FWHM value range of less than 50 microseconds, while corresponding to a frequency range of +10,000 Hz.

18. An MRI method as in claim 12, wherein a graphical user interface (GUI) is used in providing an operator with the choice of the spectral bandwidth as well as increments of frequency offset that are to be used in acquiring the k-space data of the patient tissue ROI, as data sets from a single MRI RF excitation pulse sequence, or a series of linked MRI RF excitation pulse sequences, with a substantially constant receiver gain.

19. An MRI method as in claim 18, wherein said GUI provides the operator with a choice of non-uniform increments with respect to the frequency offset.

20. An MRI method as in claim 12, wherein the acquired k-space data is analyzed by the at least one MRI processor performing, a curve fitting onto the acquired k-space data points.

21. An MRI method as in claim 12, wherein pixel data representing said MTC effects of the provided spectral peak width data in the patient ROI is overlaid respectively onto the corresponding pixels of a reconstructed MR image.

22. An MRI method as in claim 12, wherein, at least one processor calculates for the patient tissue, in the patient ROI,
(a) a first range of the spectral peak width data and
(b) a second range of the spectral peak width data in order to generate a magnetic resonance image (MRI) of the patient tissue, in the patient ROI with tissues being displayed differently corresponding to either the calculated first range or the calculated second range.

23. An MRI method as in claim 22, wherein the at least one processor generates a magnetic resonance image (MRI) of the patient tissue, in the patient ROI with one of two tissues, in the generated MRI being displayed differently based on whether said calculated first range or the calculated second range, is above or below a predetermined threshold.

* * * * *